(12) United States Patent
Arima et al.

(10) Patent No.: US 11,372,051 B2
(45) Date of Patent: Jun. 28, 2022

(54) ECONOMIC EFFICIENCY ESTIMATION APPARATUS OF RECHARGEABLE BATTERY AND ECONOMIC EFFICIENCY ESTIMATION METHOD

(71) Applicant: Daiwa Can Company, Tokyo (JP)

(72) Inventors: Masahito Arima, Sagamihara (JP); Naoki Sunaga, Sagamihara (JP); Naoki Oniki, Sagamihara (JP)

(73) Assignee: Daiwa Can Company, Tokyo (JP)

( * ) Notice: Subject to any disclaimer, the term of this patent is extended or adjusted under 35 U.S.C. 154(b) by 190 days.

(21) Appl. No.: 16/899,853

(22) Filed: Jun. 12, 2020

(65) Prior Publication Data

US 2020/0309860 A1    Oct. 1, 2020

Related U.S. Application Data

(63) Continuation of application No. PCT/JP2018/045674, filed on Dec. 12, 2018.

(30) Foreign Application Priority Data

Dec. 13, 2017  (JP) .............................. JP2017-238813

(51) Int. Cl.
*G01R 31/3835* (2019.01)
*G01R 31/36* (2020.01)

(52) U.S. Cl.
CPC ..... *G01R 31/3835* (2019.01); *G01R 31/3648* (2013.01)

(58) Field of Classification Search
CPC .......................... G01R 31/3835; G01R 31/3648

USPC ........................................................ 320/132
See application file for complete search history.

(56) References Cited

U.S. PATENT DOCUMENTS

| | | | |
|---|---|---|---|
| 6,323,620 | B1 | 11/2001 | Miyoshi et al. |
| 2016/0370431 | A1 | 12/2016 | Sejima et al. |
| 2018/0366978 | A1* | 12/2018 | Matan .................... G06Q 50/06 |
| 2020/0038289 | A1 | 2/2020 | Asano et al. |
| 2020/0163835 | A1 | 5/2020 | Asano et al. |

FOREIGN PATENT DOCUMENTS

| | | |
|---|---|---|
| CN | 1313650 A | 9/2001 |
| CN | 101726705 A | 6/2010 |
| CN | 106257737 A | 12/2016 |
| JP | 2002-131402 A | 5/2002 |
| JP | 2005-001491 A | 1/2005 |

(Continued)

OTHER PUBLICATIONS

Japanese Office Action dated Nov. 2, 2021 for Japanese Application No. 2017-238813 with English translation (5 pages).

(Continued)

*Primary Examiner* — Nathaniel R Pelton
(74) *Attorney, Agent, or Firm* — Harness, Dickey & Pierce, P.L.C.

(57) ABSTRACT

The economic efficiency estimation apparatus of the rechargeable battery and the economic efficiency estimation method thereof according to the present invention estimate an economic efficiency index correlated with a full-charge capacity and a charge/discharge energy quantity of a secondary battery, by using a voltage difference between a discharge voltage, which is precalculated, and a charge maximum voltage.

2 Claims, 8 Drawing Sheets

(56) References Cited

FOREIGN PATENT DOCUMENTS

| JP | 2014-044149 A | 3/2014 |
|---|---|---|
| JP | 2015-032067 A | 2/2015 |
| WO | WO-2011-102180 A1 | 8/2011 |
| WO | WO-2011-142114 A1 | 11/2011 |
| WO | WO-2013-168320 A1 | 11/2013 |
| WO | 2015011773 A1 | 1/2015 |
| WO | WO-2015-063914 A1 | 5/2015 |

OTHER PUBLICATIONS

English translation of International Preliminary Report on Patentability for International Application No. PCT/JP2018/045674 dated Jun. 25, 2020 (8 Pages).
International Search Report dated Mar. 5, 2019 with English translation (5 pages).
Chinese Office Action dated Feb. 10, 2022 for Chinese Application No. 201880080338.9 (with English translation) (13 pages).
Japanese Office Action dated Feb. 8, 2022 for Japanese Patent Application 2017-238813 (with English translation) (4 pages).

\* cited by examiner

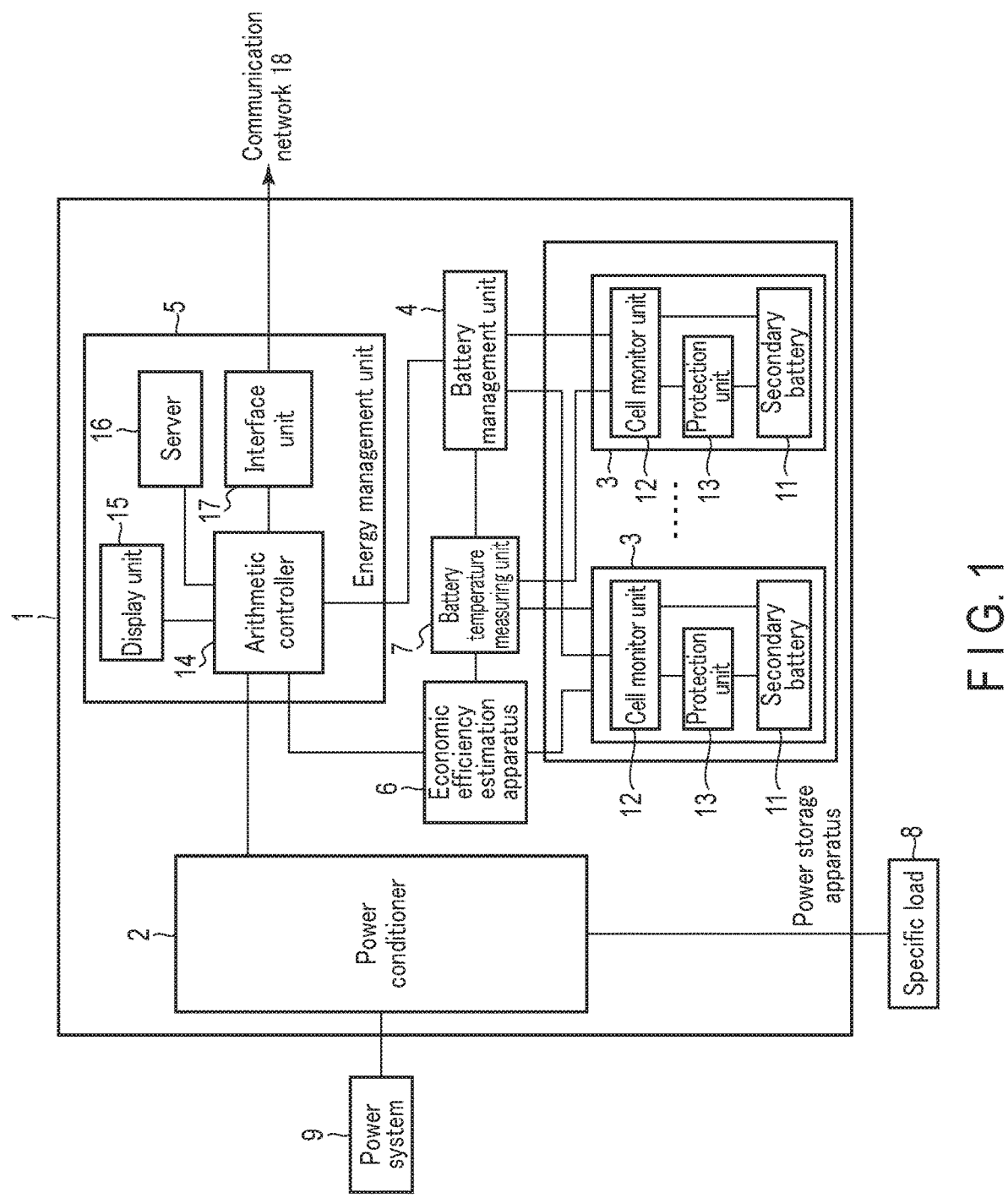
F I G. 1

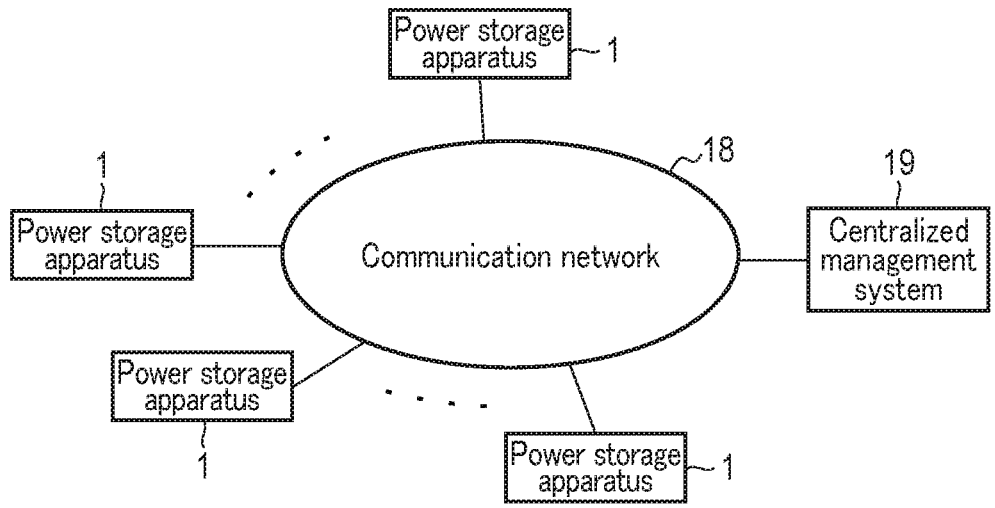
F I G. 2
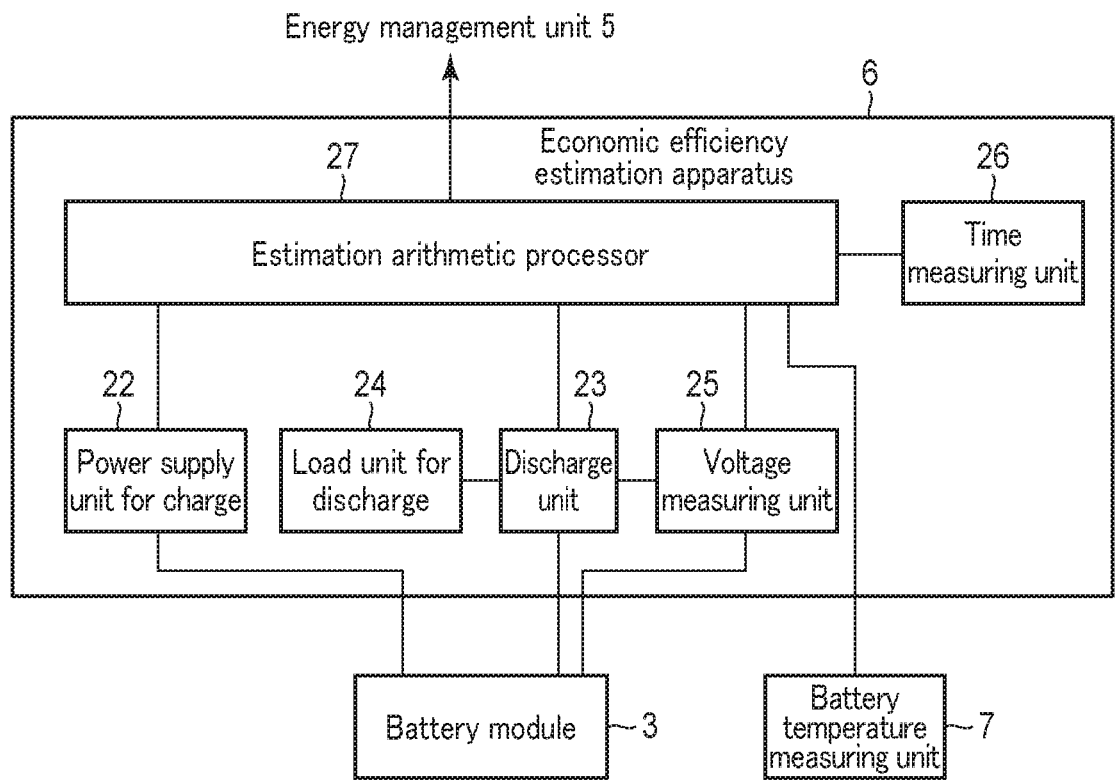
F I G. 3

| $V_{ci}=A_iV_e+B_i$ | | | | | | |
|---|---|---|---|---|---|---|
| Qci | 0.0 | 2.3 | 4.6 | 6.9 | 9.2 | 11.5 | 13.8 |
| Ai | -1.0601 | 0.2121 | 0.2943 | 0.3134 | 0.2432 | 0.1883 | 0.2421 |
| Bi | 28.547 | 28.143 | 28.234 | 28.412 | 28.735 | 29.010 | 29.132 |
| Qci | 16.1 | 18.4 | 20.7 | 23.0 | 25.3 | 27.6 | 29.9 |
| Ai | 0.3472 | 0.3567 | 0.2393 | 0.3353 | 0.2792 | 0.3228 | 0.3762 |
| Bi | 29.119 | 29.242 | 29.504 | 29.565 | 29.803 | 29.965 | 30.181 |
| Qci | 32.2 | 34.5 | 36.8 | 39.1 | 41.4 | 43.7 | |
| Ai | 0.3782 | 0.4125 | 0.4579 | 0.4759 | 0.6107 | 0.2178 | |
| Bi | 30.442 | 30.729 | 31.023 | 31.376 | 31.640 | 32.423 | |

FIG. 5

| $V_{di}=C_iV_e+D_i$ | | | | | | |
|---|---|---|---|---|---|---|
| Qci | 0.0 | 2.3 | 4.6 | 6.9 | 9.2 | 11.5 | 13.8 |
| Ci | -0.9665 | -1.0937 | -1.2967 | -1.3626 | -1.1474 | -1.0199 | -0.9652 |
| Di | 33.208 | 32.796 | 32.556 | 32.162 | 31.480 | 31.010 | 30.659 |
| Qci | 16.1 | 18.4 | 20.7 | 23.0 | 25.3 | 27.6 | 29.9 |
| Ci | -0.9467 | -0.9228 | -0.7726 | -0.8974 | -0.9327 | -0.9886 | -1.0829 |
| Di | 30.383 | 30.129 | 29.741 | 29.720 | 29.593 | 29.488 | 29.421 |
| Qci | 32.2 | 34.5 | 36.8 | 39.1 | 41.4 | 43.7 | |
| Ci | -1.2595 | -1.4075 | -1.5625 | -2.4440 | -5.2553 | -9.9951 | |
| Di | 29.419 | 29.361 | 29.249 | 29.850 | 32.233 | 35.837 | |

FIG. 6

| i | 12 | 11 | 10 | 9 |
|---|---|---|---|---|
| $a_i$ | −48.4272 | 54.8879 | 43.8830 | −6.7295 |
| i | 8 | 7 | 6 | 5 |
| $a_i$ | −56.7969 | −40.8244 | 41.2291 | 25.6693 |
| i | 4 | 3 | 2 | 1 |
| $a_i$ | 10.3543 | −30.5386 | 8.0769 | 4.0128 |
| i | 0 | | | |
| $a_i$ | 28.1005 | | | |

FIG. 7

| i | 12 | 11 | 10 | 9 |
|---|---|---|---|---|
| $b_i$ | −102.5834 | 68.9348 | 73.5011 | 30.9919 |
| i | 8 | 7 | 6 | 5 |
| $b_i$ | −33.2289 | −60.4648 | −38.3065 | 79.4087 |
| i | 4 | 3 | 2 | 1 |
| $b_i$ | −17.4631 | −9.4616 | 12.3202 | −11.1354 |
| i | 0 | | | |
| $b_i$ | 32.3021 | | | |

FIG. 8

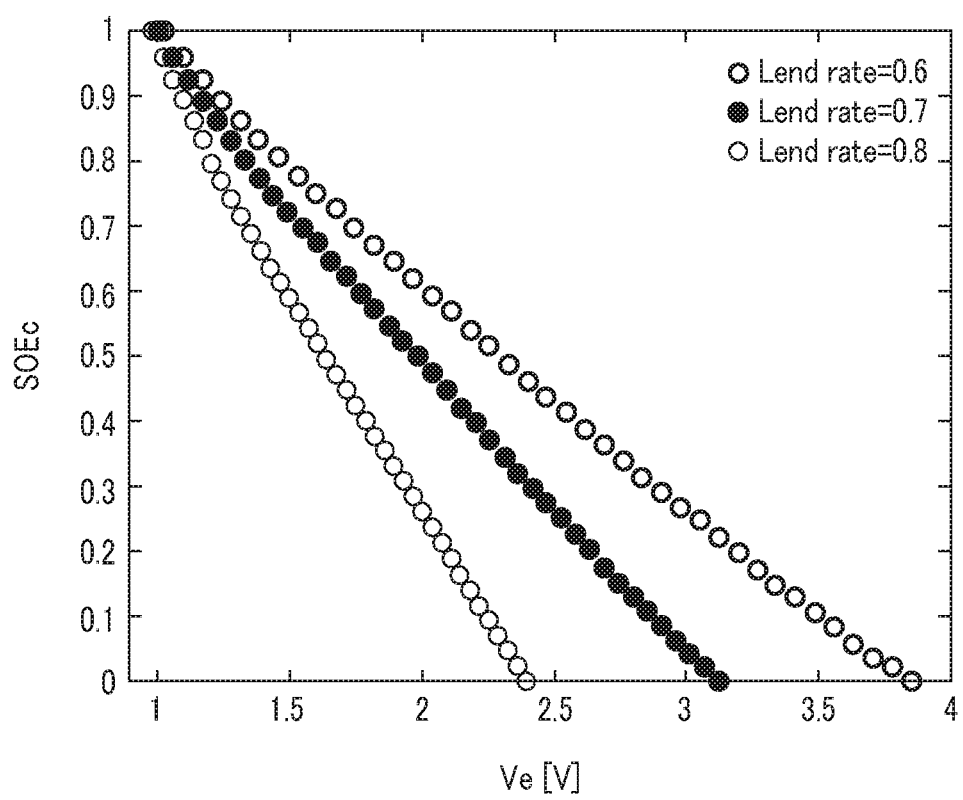
F I G. 13

ECONOMIC EFFICIENCY ESTIMATION APPARATUS OF RECHARGEABLE BATTERY AND ECONOMIC EFFICIENCY ESTIMATION METHOD

CROSS-REFERENCE TO RELATED APPLICATIONS

This application is a Continuation Application of PCT Application No. PCT/JP2018/045674, filed Dec. 12, 2018, which was published under PCT Article 21(2) in Japanese. This application is based upon and claims the benefit of priority from prior Japanese Patent Application No. 2017-238813, filed Dec. 13, 2017 the entire contents of which are incorporated herein by reference.

FIELD

Embodiments of the present invention relate to an economic efficiency estimation apparatus which estimates an economic efficiency of a rechargeable battery, and an economic efficiency estimation method.

BACKGROUND

Conventionally, there is known a lithium ion battery which is mounted in a power storage apparatus that is installed in a large building structure. The lithium ion battery is used for the purpose of peak cut by which a power demand is reduced, or for the purpose of peak shift by which nighttime power is stored for use in the daytime, or the lithium ion battery is utilized as an emergency power source for disaster countermeasures. A study has been made to obtain an economic merit by utilizing such a stationary lithium ion battery and optimizing the use of electric power at a time when electricity rates by time zone are applied. In other words, an economic merit is obtained by such an operation that the rechargeable battery is charged in a time zone with a low electricity rate, and the rechargeable battery is discharged in a time zone with a high electricity rate. Since the economic merit in this case is determined by an energy quantity that is a transaction unit of electric power, a charge energy quantity and a charge/discharge efficiency have direct influence. Accordingly, the management of a degradation state of the lithium ion battery is an important matter of concern, and methods for grasping the degradation state have been proposed.

SUMMARY

For example, patent document 1: Jpn. Pat. Appln. KOKAI Publication No. 2014-044149 proposes a residual capacity estimation method utilizing a relationship between impedances at a plurality of frequencies and discharge capacities, without measuring discharge capacities. In addition, patent document 2: Jpn. Pat. Appln. KOKAI Publication No. 2002-131402 proposes a measuring method in which a lithium ion battery that is fully charged is discharged, and the residual capacity of the battery is estimated by using a difference between discharge voltages measured at two time points after the passage of a predetermined time from the start of the discharge. These methods can estimate the residual capacity but cannot estimate a charge/discharge curve itself. Therefore, these methods are not sufficient when the degradation state is managed.

In addition, in the above-described estimation method of the degradation state, judgment based on the economic merit of the lithium ion battery is not performed. In this estimation method, it is only generally judged whether the economic efficiency lowers or not, based on the degradation state of the battery. It is thus necessary to give consideration to the accuracy of the estimation of economic efficiency.

Thus, the object of the present invention is to provide an economic efficiency estimation apparatus of a rechargeable battery, which estimates an economic efficiency index correlated with a full-charge capacity and a charge/discharge energy quantity, by using a voltage difference between a discharge voltage, which is precalculated, and a charge maximum voltage, and an economic efficiency estimation method thereof.

In order to achieve the above object, according to an embodiment of the present invention, there is provided an economic efficiency estimation apparatus of a battery, comprising: a charge unit configured to detect a charge state of a secondary battery and to fully charge the secondary battery up to a predetermined charge maximum voltage; a discharge unit configured to electrically connect a load to the fully charged secondary battery, and to discharge power from the secondary battery; a voltage measuring unit configured to measure a discharge voltage by starting measurement within a pre-specified time range after passage of a time in which a transitional response due to charge-transfer in the secondary battery disappears from a start of discharge by the discharge unit; and an estimation arithmetic processor configured to estimate an economic efficiency index SOEc represented by an equation:

$$SOE_c = (G_{curr} - G_{end})/(G_{new} - G_{end})$$

where G is an economic merit for one charge-discharge cycle expressed by $(T_{high} \times E_d - T_{low} \times E_c)/1000$, the Gcurr is an economic merit for one current charge-discharge cycle, the Gnew is an economic merit for one charge-discharge cycle at a time when the secondary battery is new, and the Gend is an economic merit for one charge-discharge cycle at a time when a battery life ends, and further Ec [Wh] is a charge energy quantity, Ed [Wh] is a discharge energy quantity, Thigh [yen/kWh] is an electricity rate in a time zone with a high electricity rate, and Tlow [yen/kWh] is an electricity rate in a time zone with a low electricity rate, the equation being correlated, by using a voltage difference between the discharge voltage calculated by measurement and the charge maximum voltage, with the voltage difference that is precalculated, and a full-charge capacity and a charge/discharge energy quantity of the secondary battery.

Further, according to an embodiment of the present invention, there is provided an economic efficiency estimation method of a battery for estimating an economic efficiency index SOEc of a secondary battery by an economic efficiency estimation apparatus of a battery, the method comprising: a full-charge process of charging the secondary battery up to a preset charge maximum voltage Vc; a stabilizing process of making a battery temperature agree with an ambient temperature after the full-charge process; a discharge process executed after the stabilizing process; a charge voltage estimation process of calculating and estimating an estimation charge voltage Vpc at a predetermined charge capacity of the secondary battery with respect to a plurality of charge capacities; and a discharge voltage estimation process of calculating and estimating an estimation discharge voltage Vpd at the predetermined discharge capacity of the secondary battery with respect to a plurality of discharge capacities, economic efficiency being estimated such that: a voltage difference Ve between a discharge voltage Vd acquired by measurement started within a specified time after a transitional response due to charge-transfer in the discharge process disappears, and the charge maximum voltage Vc, is calculated, a charge/discharge estimation process is executed in which, the estimation charge voltage Vpc at the predetermined charge capacity calculated from the voltage difference Ve is estimated based on a relational expression, $$Ve=Vc-Vd$$

$$Vpc=An \times Ve+Bn \text{ (}An \text{ and } Bn \text{ are constants)}$$

between the voltage difference Ve that is precalculated and the estimation charge voltage Vpc at the predetermined charge capacity, and the estimation discharge voltage Vpd at the predetermined discharge capacity calculated from the voltage difference Ve is estimated based on a relational expression, $$Ve=Vc-Vd$$

$$Vpd=Cn \times Ve+Dn \text{ (}Cn \text{ and } Dn \text{ are constants)}$$

between the voltage difference Ve that is precalculated and the estimation discharge voltage Vpd at the predetermined discharge capacity of the secondary battery, from the charge/discharge estimation process, a charge curve is estimated by finding an approximate curve, based on a plurality of the estimation charge voltages Vpc, and a discharge curve is estimated by finding an approximate curve, based on a plurality of the estimation discharge voltages Vpd, based on a relational expression, $$FCC=M \times Ve+N \text{ (}M \text{ and } N \text{ are constants)}$$

between the voltage difference Ve that is precalculated and a full-charge capacity FCC of the secondary battery, a full-charge capacity FCCcurr of a current charge-discharge cycle, which is calculated from the voltage difference Ve, is estimated, a charge energy quantity Eccurr of the current charge-discharge cycle is estimated from the full-charge capacity FCCcurr and the charge curve, and a discharge energy quantity Edcurr of the current charge-discharge cycle is estimated from the full-charge capacity FCCcurr and the discharge curve, from a relational expression of an economic merit G for one charge-discharge cycle, which is expressed by an equation, $$G=(T_{high} \times E_d - T_{low} \times E_c)/1000$$

an economic merit Gcurr for one current charge-discharge cycle is estimated, and, based on the relational expression of the full-charge capacity FCC, an initial full-charge capacity FCC0, which is calculated from an initial voltage difference Ve0, is estimated, an initial charge energy quantity Ec0 is estimated from the initial full-charge capacity FCC0 and the charge curve, an initial discharge energy quantity Ed0 is estimated from the initial full-charge capacity FCC0 and the discharge curve, and, from the initial charge energy quantity Ec0 and the initial discharge energy quantity Ed0, an economic merit Gnew for one initial charge-discharge cycle is estimated based on the relational expression of the economic merit G for one charge-discharge cycle, which is expressed by an equation, $$G=(T_{high} \times E_d - T_{low} \times E_c)/1000$$

based on the relational expression of the full-charge capacity FCC, a life-end full-charge capacity FCCend, which is calculated from a life-end voltage difference Veend, is calculated and estimated, a life-end charge energy quantity Ecend is estimated from the life-end full-charge capacity FCCend and the charge curve, a life-end discharge energy quantity Edend is estimated from the life-end full-charge capacity FCCend and the discharge curve, from the life-end charge energy quantity Ecend and the life-end discharge energy quantity Edend, an economic merit Gend for one life-end charge-discharge cycle is estimated based on a relational expression of the economic merit G for one charge-discharge cycle, which is represented by an equation, $$G=(T_{high} \times E_d - T_{low} \times E_c)/1000$$

and an economic efficiency index SOEc expressed by an equation, $$SOE_c=(G_{curr}-G_{end})/(G_{new}-G_{end})$$

is estimated.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram illustrating a configuration of a power storage system including an economic efficiency estimation apparatus of a rechargeable battery according to an embodiment.

FIG. 2 is a view illustrating a configuration example of a power storage system in which a plurality of power storage apparatuses execute network communication.

FIG. 3 is a block diagram illustrating a configuration example of the economic efficiency estimation apparatus of the rechargeable battery.

FIG. 5 is a view illustrating coefficients of a relational expression between a charge voltage and a voltage difference.

FIG. 6 is a view illustrating coefficients of a relational expression between a discharge voltage and a voltage difference.

FIG. 7 is a view illustrating an example of a coefficient ai of a polynomial expression.

FIG. 8 is a view illustrating an example of a coefficient bi of a polynomial expression.

FIG. 13 is a view illustrating a relationship between a voltage difference and an economic efficiency index.

DETAILED DESCRIPTION

Figure 4:
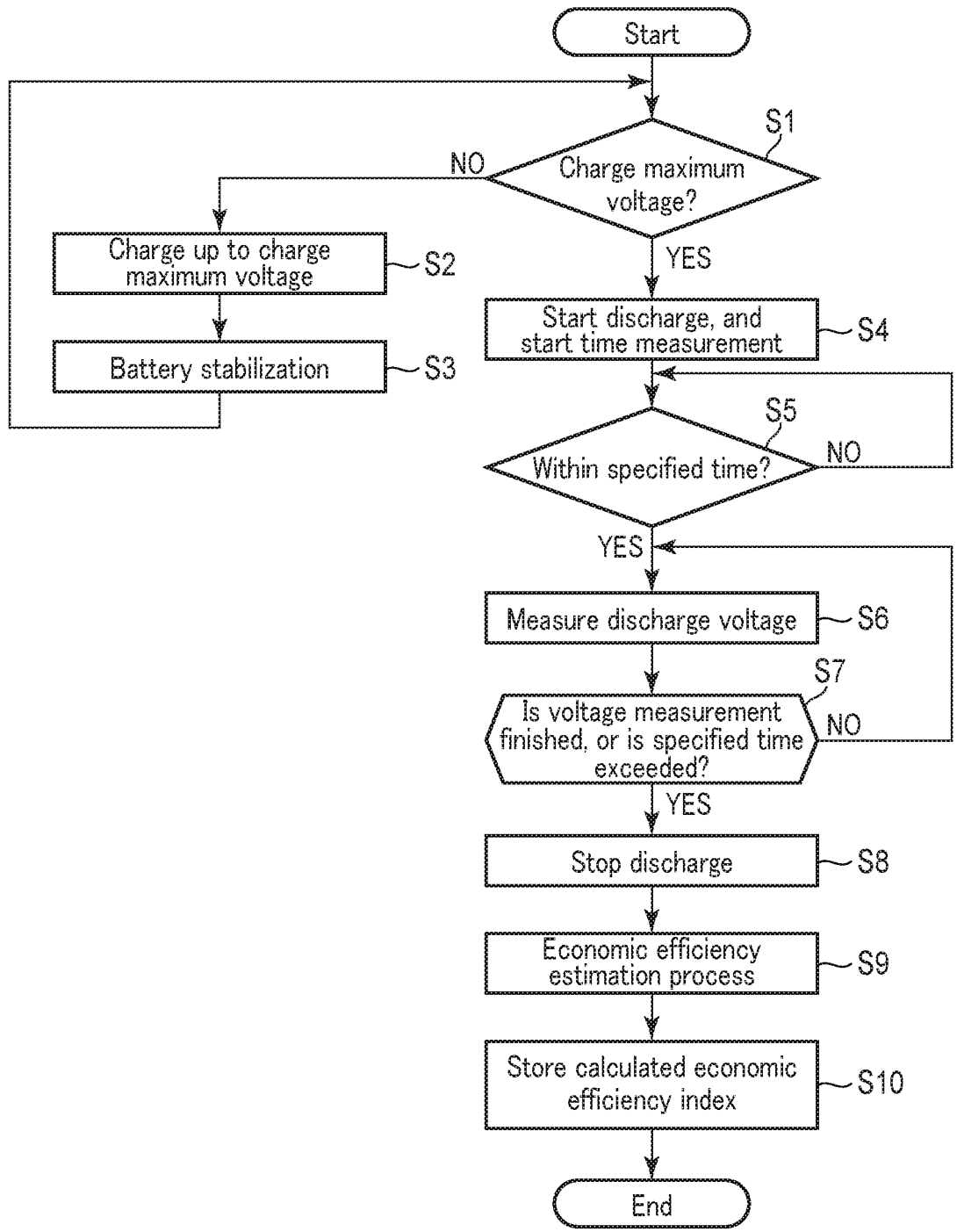
FIG. 4 is a flowchart for describing an economic efficiency estimation method by the economic efficiency estimation apparatus of the rechargeable battery.

Hereinafter, referring to the accompanying drawings, an economic efficiency estimation apparatus of a rechargeable battery and an economic efficiency estimation method thereof according to an embodiment of the present invention will be described.

FIG. 1 illustrates a configuration of a power storage apparatus including an economic efficiency estimation apparatus of a rechargeable battery according to the embodiment. The power storage apparatus 1 is composed mainly of a power conditioner (power conditioning system) 2, a battery module 3, a battery management unit (BMU) 4, an energy management unit (EMU) or energy management system (EMS) 5, an economic efficiency estimation apparatus 6, and a battery temperature measuring unit 7. Although not illustrated, structural parts that an ordinary power storage apparatus includes are assumed to be included in the power storage apparatus of the present embodiment, and a detailed description thereof is omitted.

The power conditioner 2 functions as a so-called converter which converts power supplied from a power system 9 of an external electric power company or the like, power supplied from a solar power generation system, or power supplied from the battery module 3 to power which can be utilized by an electric drive device including a specific load 8. Further, the power conditioner 2 may have a function of a charger which charges a rechargeable battery. For example, when the specific load 8 is an electric device which is driven by AC power, DC power supplied from the battery module 3 is converted to an electric power form of AC power. In addition, depending on the electric device of the specific load 8, the voltage value of power may be increased. Moreover, the power conditioner 2 does not only supply power to the specific load 8. The power conditioner 2 also releases energy accumulated in the battery module 3, when the consumption of power supplied from the power system 9 become maximum. By releasing the energy, the consumption of power supplied from the power system 9 can be decreased. In this case, when a power demand lowers, for example, in the middle of the night, the battery module 3 after discharge can be fully charged through the power conditioner 2.

It is assumed that the specific load 8, which is the destination of power supply of the power storage apparatus 1, is a device to which power is to be supplied when the power supply from the power system 9 is stopped (e.g. at a time of electric power outage). The specific load 8 is, for example, an electronic device such as a computer, or a communication device, and power supply for power source backup is performed for the specific load 8.

The battery module 3 includes a secondary battery (rechargeable battery) 11 which outputs DC voltage, a cell monitor unit (CMU) 12, and a protection unit 13. The number of battery modules 3 is properly set according to the design relating to a power supply quantity of the specific load or the like. When a large-capacity secondary battery is formed, a plurality of battery modules 3 may be electrically connected and composed as a single battery pack. In addition, in the present embodiment, a lithium ion battery is described as an example of the secondary battery 11 which is a target of charge/discharge curve estimation. However, the embodiment is not limited to this, and can easily be applied to a battery of a different structure if the battery has a low memory effect and a good self-discharge characteristic, like the lithium ion battery. The secondary battery 11 can also be applied to, for example, a nanowire battery or the like, which is an improvement of the lithium ion battery.

The secondary battery 11 of the present embodiment is not limited with respect to a battery inside material (e.g. an electrode material) or a cell structure. As regards the form of an exterior member of the secondary battery 11, the secondary battery 11 may be of a cylindrical canister type, a rectangular canister type, and a laminate type. Publicly known connection modes of a single battery, a serial coupled battery or a parallel coupled battery are applicable as the connection mode of the secondary battery 11.

The battery temperature measuring unit 7 measures the temperature by a temperature sensor (not shown) disposed in contact with each secondary battery 11.

Although the ambient temperature, at which the lithium ion battery in the apparatus is usable, is in the range of about 5 to 40° C., a temperature adjusting mechanism for batteries can be mounted in the apparatus, depending on the environment of installation (cold region or tropical region). The temperature adjusting mechanism for batteries is composed of a fan or a heater for performing temperature adjustment in a range (about 5 to 40° C.) in which the above-described secondary battery 11 is usable. When the temperature measured by the battery temperature measuring unit 7 has changed to a value above the maximum or below the lower limit of a preset temperature range, the temperature adjusting mechanism for batteries executes temperature adjustment such that the battery performance may not lower. Needless to say, if the temperature range in which the secondary battery 11 is usable will be increased by future battery improvements, it is possible to adapt to the entire temperature range.

The cell monitor unit 12 continuously measures the output voltage, current and temperature of each secondary battery 11 of the single battery (or single cell), and transmits the measurement result to the battery management unit 4. In particular, in accordance with the control of an arithmetic controller 14 (to be described later), during a discharge process for charge/discharge curve estimation, the cell monitor unit 12 measures a discharge voltage Vd within a predetermined time specified from a discharge time in which a transitional response due to charge-transfer disappears.

Furthermore, the cell monitor unit 12 transmits the output voltage, current and temperature, which are acquired from the secondary battery 11, to the battery management unit 4 as monitor information. Based on the received monitor information, the battery management unit 4 judges the occurrence of abnormality such as over-charge, over-discharge and temperature rise, controls the protection unit 13, and stops charge or output (discharge) for the secondary batteries 11, thereby preventing over-charge and over-discharge. Note that, when urgent abnormality occurs due to a fault or the like of the secondary battery 11, the protection unit 13 stops charge or output (discharge) for the secondary battery 11 by electrical shutoff. Besides, a function of avoiding danger may be provided by reporting abnormality to the battery management unit 4. Although the judgment of the occurrence of abnormality is indispensable, the judgment function may be provided in either the cell monitor unit 12 on the battery module 3 side or the battery management unit 4 on the power storage apparatus 1 side, or the safety may be enhanced by double judgment by providing the judgment function in both the cell monitor unit 12 and the battery management unit 4. In the double judgment, the priority of judgment is determined in advance, and, for example, the cell monitor unit 12 first judges the occurrence of abnormality and then the battery management unit 4 judges, as a second judgment, the occurrence of abnormality. Normally, in the judgment process at this time, when one of two judgment units judges the abnormality, the protection operation by the protection unit 13 is executed. Although depending on the concept of design, such a configuration is possible that the protection operation by the protection unit 13 is executed only when both judgment units judge the abnormality, and an alert is issued when only one of both judgment units judges the abnormality.

In addition, the battery management unit 4 collects, in a centralized manner, pieces of monitor information transmitted from the cell monitor units 12 of the battery modules 3, and sends the monitor information to the energy management unit 5 of an upper level. Based on the monitor information, the energy management unit 5 instructs the power conditioner 2 to execute charge and discharge of the battery modules 3. In accordance with the instruction, the power conditioner 2 controls charge and discharge of the battery modules 3.

The energy management unit 5 is composed of an arithmetic controller 14, a display unit 15, a server 16 and an interface unit 17.

The arithmetic controller 14 has the same function as an arithmetic processor or the like of a computer. The arithmetic controller 14 instructs the battery management unit 4 to charge and discharge the battery modules 3, and instructs the power conditioner 2 to charge and discharge the battery modules 3. In addition, a charge maximum voltage value and a discharge minimum voltage value are preset for each of the battery modules 3. The arithmetic controller 14 instructs the stop of charge and the stop of discharge, based on the monitor information transmitted from the energy management unit 5.

The display unit 15 is composed of, for example, a liquid crystal display unit, and displays, by the control of the arithmetic controller 14, the operation state of the power storage apparatus 1, the residual capacity or the like of the battery modules 3 (secondary batteries 11), and alert items. Besides, the display unit 15 may be used as an input device by adopting a touch panel or the like.

The server 16 constantly stores, in an accumulating manner, the latest information of the operation state of the power storage apparatus 1 sent to the energy management unit 5, the monitor information relating to the battery modules 3 or the like, and the information relating to charge/discharge curves. As illustrated in FIG. 2, the interface unit 17 communicates with a centralized management system 19, which is installed on the outside, via a communication network 18 such as the Internet.

Next, the economic efficiency estimation apparatus 6 of the rechargeable battery will be described. FIG. 3 illustrates a configuration example of the economic efficiency estimation apparatus 6 of the rechargeable battery.

The economic efficiency estimation apparatus 6 is composed of a power supply unit 22 for charge, a discharge unit 23, a load unit 24 for discharge, a voltage measuring unit 25, a time measuring unit 26, and an estimation arithmetic processor 27. The economic efficiency estimation apparatus 6 estimates an economic efficiency index SOEc (to be described later) in the secondary batteries 11 in the battery modules 3. The estimated economic efficiency index SOEc of each secondary battery 11 is stored in the server 16.

The power supply unit 22 for charge outputs a DC voltage, which matches with the rating of the secondary battery 11, to the secondary battery 11, and fully charges the secondary battery 11. The power supply unit 22 for charge is provided as an exclusive power supply for estimating the economic efficiency index SOEc of the secondary battery 11. In addition, a battery-charge power supply unit, which is normally provided in the power storage apparatus or power conditioner 2, may be used as the power supply unit 22 for charge. In the present embodiment, the voltage measuring unit 25 and the power supply unit 22 for charge constitute a charge unit.

The discharge unit 23 includes the load unit 24 for discharge. The discharge unit 23 electrically connects the secondary battery 11 and the load unit 24 for discharge by a switch operation (not illustrated), and causes the secondary battery 11 to discharge a predetermined energy quantity (here, a constant current or a constant voltage is assumed). The load unit 24 for discharge may be a resistor or an electronic load. Alternatively, without providing such an exclusive load, a load may be simulated and regeneration to the power system may be performed.

The voltage measuring unit 25 measures a DC voltage which the battery module 3 (secondary battery 11) outputs. As regards the timing of measurement, as will be described later, a DC voltage, which is output from the battery module 3 is measured within a time specified after the passage of a time in which a transitional response due to charge-transfer by discharge disappears. Note that, as regards the implementation of voltage measurement, even if voltage measurement is not actually performed, it is possible to make applicable use of the voltage value included in the monitor information which is sent from the battery management unit 4 and stored in the server 16 of the energy management unit 5. The time measuring unit 26 is a timer for measuring a time in which power is discharged from the battery module 3.

The estimation arithmetic processor 27 is an arithmetic processor (CPU or the like) which stores an arithmetic algorism using a relational expression (to be described later) and estimates economic efficiency, based on the measured voltage value of the secondary battery 11. Even if the estimation arithmetic processor 27 is not exclusively provided in the economic efficiency estimation apparatus 6 of the rechargeable battery, the arithmetic controller 14 of the energy management unit 5 may be substituted to execute the processing function. As illustrated in FIG. 1, the battery module 3 includes the secondary battery (rechargeable battery) 11 which outputs DC voltage, cell monitor unit 12, and protection unit 13. The number of battery modules 3 is properly set in accordance with the design in the power supply quantity of the specific load or the like, and the battery modules 3 constitute a large-capacity secondary battery. In this case, a plurality of battery modules 3 may be electrically connected and constituted as a single battery pack.

In addition, in the present embodiment, although a lithium ion battery is described as an example of the secondary battery 11 that is a target of economic efficiency estimation, the embodiment is not limited to this. The embodiment is easily applicable to a battery of a different structure if the battery has a low memory effect and a good self-discharge characteristic, like the lithium ion battery, and is also applicable to a nanowire battery or the like, which is an improvement of the lithium ion battery.

Next, referring to a flowchart of FIG. 4, an economic efficiency estimation method by the economic efficiency estimation apparatus of the present embodiment will be described.

To start with, the voltage measuring unit 25 measures the charge state in the secondary battery 11 of the battery module 3 mounted in the power storage apparatus 1. It is judged whether the measured voltage is a charge maximum voltage Vcharge-max (hereinafter referred to as "Vc") which is a preset full-charge state (step S1). In this judgment, if the measured voltage is not the full-charge state (NO), the secondary battery 11 is charged up to the charge maximum voltage Vc by the power supply unit 22 for charge (step S2).

When the full-charge process is performed, monitor and control are executed such that the secondary battery 11 is not charged above the charge maximum voltage Vc. As the charging method, any one of constant current, constant current/constant voltage, constant power, and constant power/constant voltage can be adopted. When the method of constant current or constant power is adopted, the voltage of the secondary battery 11 is measured while being charged, and the charge is stopped when the voltage has reached the charge maximum voltage Vc. In addition, in the case where the method of constant current/constant voltage or constant power/constant voltage is adopted, from the time when the voltage of the battery has reached the charge maximum voltage Vc, the charge current is decreased while the battery voltage is kept at the charge maximum voltage Vc. Thereafter, the charge is stopped when the time measuring unit has measured a predetermined fixed time from the time at which the battery voltage reached the charge maximum voltage Vc, or when the charge current has decreased to a predetermined fixed value. The charging work may be automatically controlled by condition setup, or may be manually controlled by a person in charge of the measurement.

After the completion of the charge process, the battery temperature measuring unit 7 measures the temperature of the secondary battery 11, and a stabilizing process is executed to leave the battery until the battery temperature, which is raised by the charge, agrees with the ambient temperature (step S3). Note that in the stabilizing process, the time needed until the battery temperature agrees with the ambient temperature is not uniform and varies depending on the kind of the secondary battery 11. In addition, the stabilizing process time needs to be greater than such a length of time that the transitional response after the completion of charge is attenuated, and is generally several-ten minutes or more. On the other hand, in the judgment of step S1, if the voltage of the secondary battery 11 is approximately the charge maximum voltage Vc (full-charge state) (YES), the economic efficiency estimation of the rechargeable battery is performed.

To begin with, the secondary battery 11 is electrically connected to the load unit 24 for discharge by the discharge unit 23 and the discharge is started, and the time measuring unit 26 starts measurement of time (step S4). As the discharge method, a method by constant current or a method by constant power can be selected. After the start of discharge, it is judged whether time has come within a specified time (to be described later) determined by the time in which a transitional response due to charge-transfer disappears (step S5). In this judgment, if time has come within the specified time (YES), the voltage measuring unit 25 measures a discharge voltage Vdischarge (hereinafter referred to as "Vd") of the secondary battery 11 (step S6).

Next, it is judged whether the measurement of the discharge voltage Vd is finished, or whether the time measured by the time measuring unit 26 has exceeded the range of the specified time (step S7). In this judgment, if the voltage measurement is finished, or if the time measured by the time measuring unit 26 has exceeded the range of the specified time (YES), the discharge of the secondary battery 11 is stopped by the discharge unit 23 (step S8). On the other hand, when the measured time has exceeded the range of the specified time (NO), the discharge is stopped. However, if the measurement of the discharge voltage Vd is started within the range of the specified time, the discharge is continued until the end of measurement. Note that when the discharge voltage Vd could not be measured within the range of the specified time, an error is reported to the measuring person or manager. The discharge for the measurement may be performed by utilizing the discharge start time at a time of actual use. Even when the specified time of measurement from the start of discharge is exceeded, there is a case in which the discharge is continued depending on the situation. Needless to say, the discharge may be stopped after the specified time of measurement.

Subsequently, an economic efficiency estimation process (to be described later) is executed (step S9). Based on the acquired discharge voltage Vd, an estimation charge voltage Vpc at a predetermined charge capacity and an estimation discharge voltage Vpd at a predetermined discharge capacity are calculated by using a relational expression (to be described later), and charge/discharge curves are estimated from the calculated estimation charge voltage Vpc and estimation discharge voltage Vpd. In addition, a full-charge capacity FCC, a charge energy quantity Ec and a discharge energy quantity Ed in a predetermined charge-discharge cycle, and an economic merit G in one charge-discharge cycle are estimated, and an economic efficiency index SOEc is estimated. The estimated economic efficiency index SOEc is stored in the server 16 of the energy management unit 5 (step S10). The stored economic efficiency index SOEc is read out from the server 16 by request, and displayed on the display unit 15.

Note that in the economic efficiency estimation process, the charge process to the charge maximum voltage Vc or the battery temperature stabilization, or the voltage measurement that is performed at the time of the discharge process, may be performed for a single battery. Further, the single battery may be a plurality of single batteries which are connected in parallel or in series in an assembled battery unit. Besides, the charge process or the battery temperature stabilization, or the voltage measurement at the time of the discharge process, may be performed for an assembled battery unit in which single batteries are connected in parallel or in series. The assembled battery unit may be a plurality of assembled battery units which are connected in parallel or in series as a battery unit of a power storage system.

Here, a description will be given of the specified time in which the discharge voltage Vd is measured in the above-described step S5.

Discharge is started by electrically connecting, by the discharge unit 23, the battery module 3 to the load unit 24 for discharge. In the present embodiment, the measurement of the discharge voltage Vd is not started immediately after the start of discharge, but the measurement stands by until reaching a fixed time. This fixed time needs to be a time which is greater than a time in which a diffusion impedance begins to occur, and needs to be such a time that a charge rate SOC does not greatly vary, and the fixed time is set to several-ten seconds (e.g. 10 seconds to 70 seconds).

In the present embodiment, the range of the specified time is set based on the study on a measurement result which is measured in advance. Here, the specified time range in which the discharge voltage Vd is measured from the discharge start is set to, for example, 10 seconds to 70 seconds. If this standby time is less than 10 seconds, there is concern that, due to the influence of the occurrence of charge-transfer impedance, the estimation precision of the estimation charge voltage Vpc and estimation discharge voltage Vpd at a predetermined charge capacity lowers. In addition, if the standby time is about 70 seconds, the standby time is enough to start the voltage measurement. Even if the standby time is greater than 70 seconds, a conspicuous improvement cannot be expected for the estimation precision of the estimation charge voltage Vpc and estimation discharge voltage Vpd at a predetermined charge capacity, and thus the energy quantity stored in the secondary battery 11 is greatly consumed by long-time discharge. Needless to say, this specified time range is merely an example, and is not strictly limited, and is variable when the apparatus configuration or measurement characteristics are different.

In the present embodiment, the specified time range is set, for example, between 10 seconds and 70 seconds, and the measurement of the discharge voltage Vd of the secondary battery 11 is started within the range of the specified time. When the voltage measurement is finished, the discharge of the secondary battery 11 is stopped even within the range of the specified time, i.e. within 70 seconds. In addition, in the case where the voltage measurement is not started even if the elapsed time from the discharge start exceeds the range of the specified time, the discharge is stopped and this case is treated as a measurement error.

Next, a description will be given of the economic efficiency estimation process of the present embodiment in the above-described step S9.

To begin with, in order to estimate economic efficiency, charge/discharge curves are estimated. It is assumed that a difference between the preset charge maximum voltage Vc and the discharge voltage Vd measured within the specified time is a voltage difference Vdifference (hereinafter referred to as "Ve"). The charge/discharge curves can be calculated from the estimation charge voltage Vpc at a predetermined charge capacity which is estimated from the voltage difference Ve, and the estimation discharge voltage Vpd at the predetermined discharge capacity.

The voltage difference Ve and the estimation charge voltage Vpc at the predetermined charge capacity have a linear relationship of a linear increase, and exhibit a positive correlation. Accordingly, a relational expression of the voltage difference Ve at each charge capacity and the estimation charge voltage Vpc at the predetermined charge capacity is obtained by linear approximation by a least squares method.

Based on a relational expression (1) of the precalculated voltage difference Ve (maximum voltage difference) and estimation charge voltage Vpc, $$Ve = Vc - Vd$$

$$Vpc = An \times Ve + Bn \text{ (} An \text{ and } Bn \text{ are constants)} \quad (1)$$

a charge curve can be estimated from the estimation charge voltage Vpc which is calculated from the voltage difference Ve. Here, the constants An and Bn in the relational expression can be calculated by linear approximation by a least squares method, based on the charge result obtained from a plurality of charge-discharge cycles of the maximum voltage difference Ve and estimation charge voltage Vpc in a charge-discharge cycle test of the battery module.

In addition, the voltage difference Ve and the estimation discharge voltage Vpd at the predetermined charge capacity have a linear relationship of a linear decrease, and exhibit a negative correlation. Accordingly, a relational expression of the voltage difference Ve at each charge capacity and the estimation discharge voltage Vpd at the predetermined charge capacity is obtained by linear approximation by a least squares method. Specifically, based on the precalculated maximum voltage difference Ve and estimation discharge voltage, a charge curve can be estimated from the estimation charge voltage Vpc calculated from the maximum voltage difference Ve, and, based on a relational expression (2) of Vpd, $$Ve = Vc - Vd$$

$$Vpd = Cn \times Ve + Dn \text{ (} Cn \text{ and } Dn \text{ are constants)} \quad (2)$$

a discharge curve can be estimated from the estimation discharge voltage Vpd calculated from the maximum voltage difference Ve. Here, the constants Cn and Dn in the relational expression can be calculated by linear approximation by a least squares method, based on the discharge result obtained from a plurality of charge-discharge cycles of the maximum voltage difference Ve and estimation discharge voltage Vpd in a charge-discharge cycle test of the battery module.

As described above, charge/discharge curves can be estimated if approximate curves are found by various methods, such as a least squares method, from discrete data of the estimated estimation charge voltage Vpc and estimation discharge voltage Vpd at the predetermined charge capacity. In the present embodiment, a polynomial regression analysis, which approximates charge/discharge curves by a 12th order polynomial, is used.

In the present embodiment, a lithium ion battery 8-serial module with a rated capacity of 500 Ah and a rated voltage of 29.6 V is used, and a charge/discharge test was conducted by a constant power method of 1085 W. Note that an interval of 1.5 hours was provided between charge and discharge. Measurement was conducted with a time resolution of 1 sec, with respect to the voltage (resolution 0.001 V) of each cell, an inter-cell temperature (resolution 0.1° C.) of every two cells, and a current (resolution 0.001 A) flowing through the entire module.

Here, the charge/discharge curves are functions of the estimation charge voltage Vpc and estimation discharge voltage Vpd, which can be expressed as Vpc(SOC) and Vpd(SOC) as a function of a charge rate SOC (=Qc/FCC) which is a value obtained by dividing the charge current quantity Qc [Ah] by the full-charge capacity FCC [Ah] at that time point. These can be expressed by equations (3) and (4) as 12th order polynomials.

$$Vpc(SOC) = \Sigma_{i=0}^{12} a_i SOC^i \quad (3)$$

$$Vpd(SOC) = \Sigma_{i=0}^{12} b_i SOC^i \quad (4)$$

Here, discrete data of the charge current quantity Qc [Ah] and discharge current quantity Qd [Ah] are assumed to be Qcdig and Qddig, and a charge voltage Vpcdig and a discharge voltage Vpddig corresponding to Qcdig and Qddig are defined by equations (5) to (8).

$$Qcdig = [Qc1, Qc2, \ldots, Qcn] \quad (5)$$

$$Qddig = [Qd1, Qd2, \ldots, Qdn] \quad (6)$$

$$Vpcdig = [Vpc1, Vpc2, \ldots, Vpcn] \quad (7)$$

$$Vpddig = [Vpd1, Vpd2, \ldots, Vpdn] \quad (8)$$

In addition, the charge voltage Vpcdig and discharge voltage Vpddig can be expressed by equations (9) and (10) as linear functions of the above-described voltage difference Ve.

$$Vpcdig = [A1Ve + B1, A2Ve + B2, \ldots, AnVe + Bn] \quad (9)$$

$$Vpddig = [C1Ve + D1, C2Ve + D2, \ldots, CnVe + Dn] \quad (10)$$

Here, it is assumed that a discrete width of a charge current quantity Qci [Ah] and a discharge current quantity Qdi [Ah] is 2.3 [Ah]. Coefficients Ai and Bi in the charge current quantity Qci and coefficients Ci and Di in the discharge current quantity Qdi are determined by the charge/discharge test of the battery module, and are shown in tables of FIG. 5 and FIG. 6. FIG. 5 is a view illustrating coefficients of a relational expression between a charge voltage Vci and the voltage difference Ve. FIG. 6 is a view illustrating coefficients of a relational expression between a discharge voltage Vdi and the voltage difference Ve.

The charge voltage Vpcdig and Vpddig obtained here are vectors corresponding to the charge current quantity Qcdig [Ah] and Qddig [Ah]. In order to estimate the charge voltage Vc(SOC) and discharge voltage Vd(SOC), vectors corresponding to the charge rate SOC is necessary, and thus the equations are converted. With respect to the charge current quantity Qcdig [Ah] and Qddig [Ah], when a discrete decomposition number in the range of the full-charge capacity FCC is assumed to be infinite, a relation of equation (11) is established.

$$FCC = Qci + Qdn - i \quad (11)$$

The charge voltage Vpc(SOC) and discharge voltage Vpd(SOC) can be expressed as the following equations (12) and (13) from the above-described equations (3), (4), (7), (8) and (11).

$$Vpc\ dig(SOC) = Vpc\ dig(Qc\ dig/FCC) \quad (12)$$
$$= \sum_{i=0}^{12} a_i (Qc\ dig/FCC)^i$$

$$Vpd\ dig(SOC) = Vpd\ dig((FCC - Qd\ dig)/FCC) \quad (13)$$
$$= \sum_{i=0}^{12} a_i ((FCC - Qd\ dig)/FCC)^i$$

As will be described later, since the full-charge capacity FFC can be estimated from the voltage difference Ve, the charge voltage Vpcdig and Vpddig can be converted to vectors corresponding to the charge rate SOC by equations (12) and (13). By finding coefficients Ai, Bi, Ci and Di in advance, coefficients ai and bi of the 12th order polynomial, which represents the charge/discharge curves, can be fitted by equations (12) and (13).

Specifically, there is posed a problem of optimization for minimizing evaluation coefficients Jc and Jd in the following equations (14) to (19).

$$X_c = \begin{pmatrix} \left(\frac{Q_{c1}}{FCC}\right)^{12} & \cdots & \left(\frac{Q_{c1}}{FCC}\right)^0 \\ \vdots & \ddots & \vdots \\ \left(\frac{Q_{cn}}{FCC}\right)^{12} & \cdots & \left(\frac{Q_{cn}}{FCC}\right)^0 \end{pmatrix} \quad (14)$$

$$X_d = \begin{pmatrix} \left(\frac{FCC - Q_{d1}}{FCC}\right)^{12} & \cdots & \left(\frac{FCC - Q_{d1}}{FCC}\right)^0 \\ \vdots & \ddots & \vdots \\ \left(\frac{FCC - Q_{dn}}{FCC}\right)^{12} & \cdots & \left(\frac{FCC - Q_{dn}}{FCC}\right)^0 \end{pmatrix} \quad (15)$$

$$a = [a_1, \ a_2, \ \ldots \ a_{12}] \quad (16)$$

$$b = [b_1, \ b_2, \ \ldots \ b_{12}] \quad (17)$$

$$J_c = \|V_{cdig} - aX_C^T\| \quad (18)$$

$$J_d = \|V_{ddig} - bX_C^T\| \quad (19)$$

Figure 9:
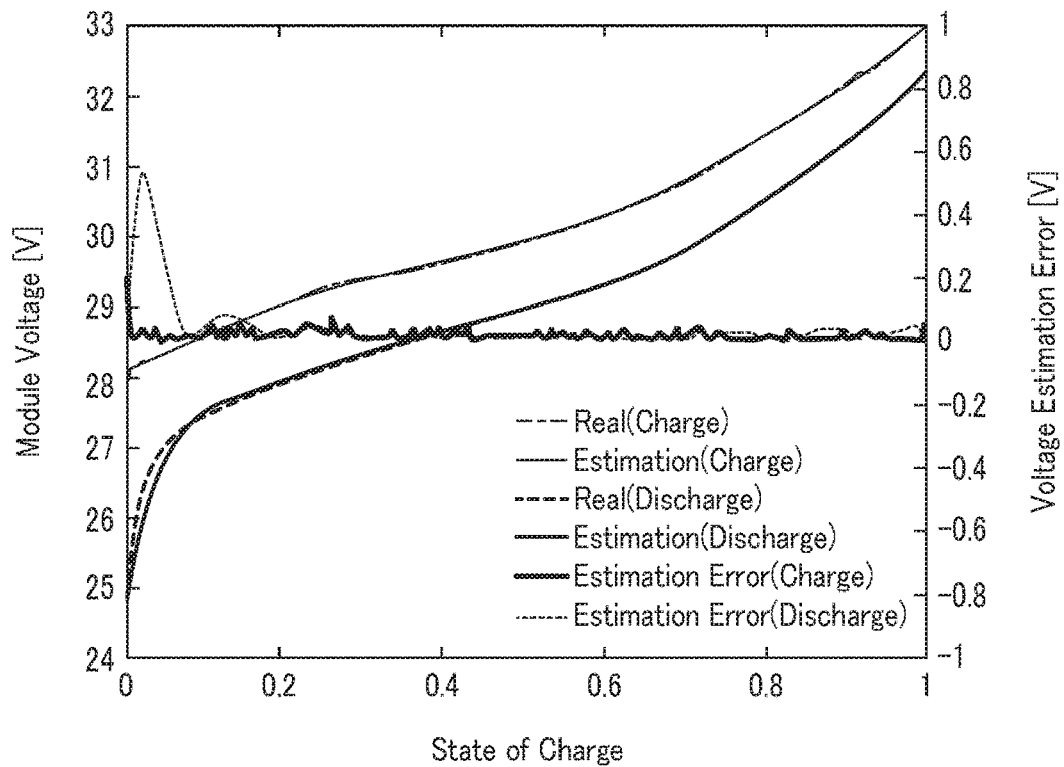
FIG. 9 is a view illustrating a polynomial regression result of charge/discharge curves.

FIG. 7 illustrates the coefficient ai that is approximated by the above method, and FIG. 8 illustrates the coefficient bi. FIG. 7 is a view illustrating an example of the coefficient ai of the polynomial expression. FIG. 8 is a view illustrating an example of the coefficient bi of the polynomial expression. In addition, FIG. 9 is a view illustrating approximate curves of polynomial regression results of charge/discharge curves. In the present embodiment, the approximate equation of the 12th order polynomial is found by the polynomial regression analysis, but the approximate curves can be found by performing curve fitting by an appropriate method.

Figure 10:
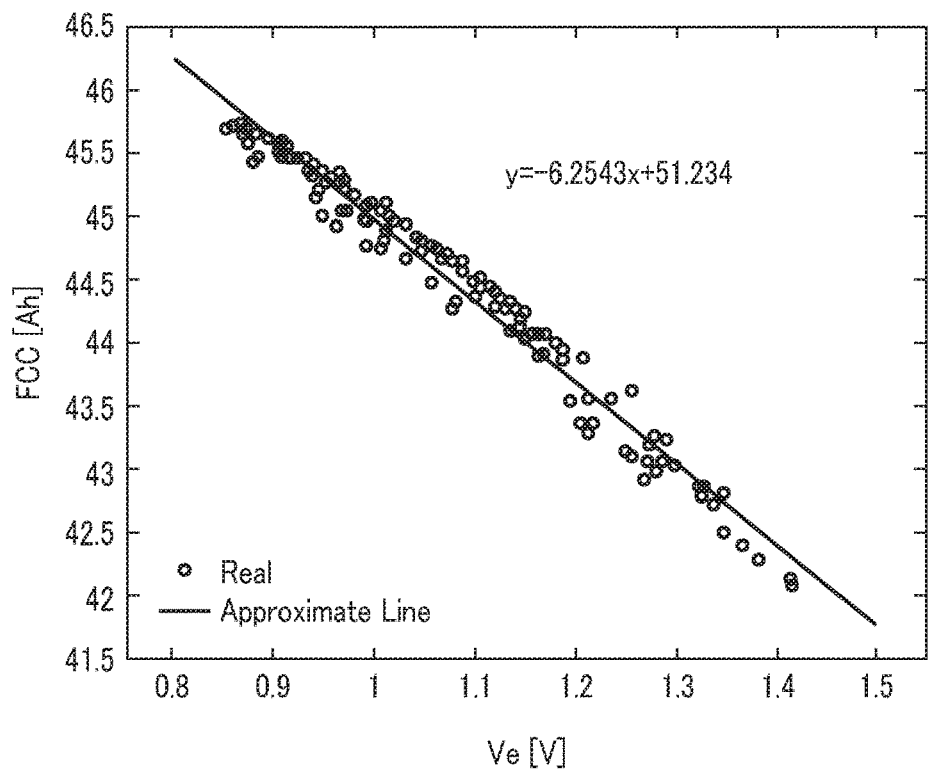
FIG. 10 is a view illustrating a relationship between a voltage difference from a discharge voltage after 20 seconds from the start of discharge and a full-charge capacity in an 8-serial module of the present embodiment.

In addition, the full-charge capacity FCC can be estimated from the voltage difference Ve. FIG. 10 is a view illustrating a relationship between the voltage difference Ve from the discharge voltage Vd after 20 seconds from the start of discharge and the full-charge capacity FCC in the 8-serial module of the present embodiment. The voltage difference Ve and the full-charge capacity FCC have a close correlation, and have a relationship of a linear expression. By finding the relational expression in advance, the full-charge capacity FCC can be estimated from the voltage difference Ve. Specifically, the full-charge capacity FCC can be estimated by the following equation (20).

$$FCC = M \times Ve + N \ (M \text{ and } N \text{ are constants}) \quad (20)$$

If the full-charge capacity FCC, and the charge voltage Vpc(SOC) and discharge voltage Vpd(SOC) can be estimated, a charge energy quantity Ec (Wh) and discharge energy quantity Ed (Wh) can be estimated by the following equations.

$$E_c = FCC \int_0^1 V_c(SOC) dSOC \quad (21)$$

$$E_d = FCC \int_0^1 V_d(SOC) dSOC \quad (22)$$

Here, if an electricity rate in a time zone with a high rate is Thigh [yen/kWh] and an electricity rate in a time zone with a low rate is Tlow [yen/kWh], an economic merit G [yen/kWh] in one charge-discharge cycle can be expressed by the following equation (23).

$$G = (T_{high} \times E_d - T_{low} \times E_c)/1000 \quad (23)$$

Figure 11:
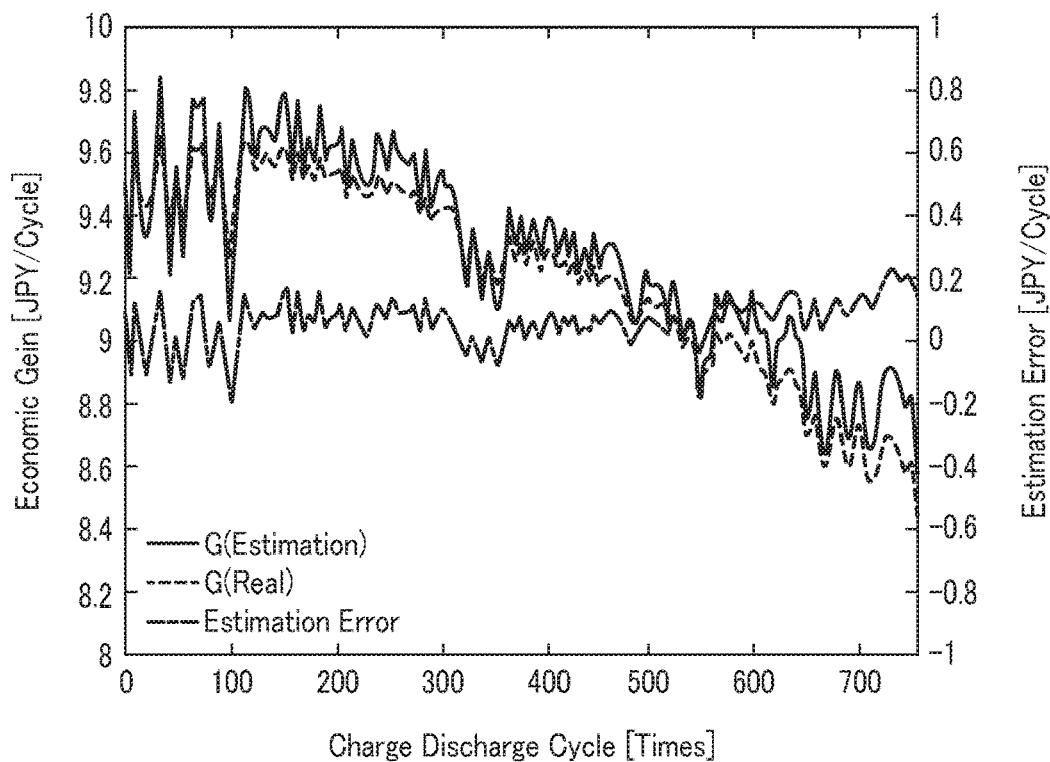
FIG. 11 is a view for describing an economic merit estimated from a voltage difference of each cycle.

FIG. 11 illustrates an economic merit G [yen/kWh] obtained by estimating the charge energy quantity Ec and discharge energy quantity Ed from the voltage difference Ve, in the charge/discharge test of the lithium ion battery 8-serial module of the present embodiment. Note that a high value Thigh of the electricity rate is set at 25.33 yen/kWh and a low value Tlow is set at 17.46 yen/kWh, with reference to the Smart Life Plan (as of Sep. 16, 2017) of TEPCO Energy Partner, Incorporated.

In general, the economic merit G (yen/kWh) of the rechargeable battery has a highest value when the rechargeable battery is a new one which has a high value of the charge/discharge efficiency (Wh/Wh), and the economic merit G (yen/kWh) of the rechargeable battery has a lowest value at the time of the end of life of the rechargeable battery, at which the degradation of the rechargeable battery progresses and the full-charge capacity FCC (Ah) and charge/discharge efficiency (Wh/Wh) have low values. In the case of the lithium ion battery, the time when the full-charge capacity FCC (Ah) has decreased to 60% or 80% of the full-charge capacity FCC (Ah) at a time when the lithium ion battery was new, is usually defined as the time of the end of life.

Here, assuming that the time when an economic merit Gnew of a new rechargeable battery is obtained is 1 and the time when only an economic merit Gend of a rechargeable battery at the time of the end of life is obtained is 0, SOEc (State of Economy) that is an economic efficiency index of the rechargeable battery, which represents the state of a current economic merit Gcurr of the rechargeable battery, is defined by the following equation (24).

$$SOE_c = (G_{curr} - G_{end})/(G_{new} - G_{end}) \quad (24)$$

where G is an economic merit for one charge-discharge cycle expressed by equation (23), Gcurr is a current economic merit for one charge-discharge cycle, Gnew is an economic merit for one charge-discharge cycle at a time when the rechargeable battery is new, and Gend is an economic merit for one charge-discharge cycle at a time when the life of the rechargeable battery ends.

The current economic merit Gcurr for one charge-discharge cycle can be estimated by the relational expression of the economic merit G for one charge-discharge cycle, by using the following estimation result. To begin with, a charge curve is estimated by finding an approximate curve, based on a plurality of the estimation charge voltages Vpc. A discharge curve is estimated by finding an approximate curve, based on a plurality of the estimation discharge voltages Vpd. Based on the relational expression of the precalculated voltage difference Ve and the full-charge capacity FCC of the secondary battery, a full-charge capacity FCCcurr of the current charge-discharge cycle, which is calculated from the voltage difference Ve, is estimated. A full-charge energy quantity Ecurr of the current charge-discharge cycle is estimated from the FCCcurr and the charge curve. The discharge energy quantity Edcurr of the current charge-discharge cycle is estimated from the full-charge capacity FCCcurr and the discharge curve.

In addition, the economic merit Gnew for one charge-discharge cycle at a time when the rechargeable battery is new can be estimated from the following estimation result, based on the relational expression. To begin with, based on the relational expression of the full-charge capacity FCC, an initial full-charge capacity FCC0, which is calculated from an initial voltage difference Ve0, is calculated and estimated, and an initial charge energy quantity Ec0 is estimated from the initial full-charge capacity FCC0 and the charge curve. Further, an initial discharge energy quantity Ed0 is estimated from the initial full-charge capacity FCC0 and the discharge curve, and the initial charge energy quantity Ec0 and initial discharge energy quantity Ed0 are found.

Assuming that the electricity rate system by time zone does not change and that the tendency of degradation of the lithium ion battery does not change, both the full-charge capacity FCC [Ah] and the charge/discharge curves, which determine the economic merit, can be estimated from the voltage difference Ve. Accordingly, the SOEc can be estimated from the voltage difference Ve of the stationary lithium ion battery which is being operated. Assuming that a life-end full-charge capacity FCCend is multiplied by initial Lendrate (0<Lendrate<1) and the relation between the voltage difference Ve and the full-charge capacity FCC is equation (20), a life-end voltage difference Veend can be calculated by equation (25) from the initial voltage difference Ve0. Charge/discharge curves at the end of life can be obtained from the life-end voltage difference Veend, and a life-end economic merit Gend can be obtained therefrom.

The charge/discharge curves at the end of life can be obtained from the life-end voltage difference Veend, a life-end charge energy quantity Ecend and a life-end discharge energy quantity Edend are estimated from the life-end full-charge capacity FCCend and the charge/discharge curves at the end of life, and the life-end economic merit Gend can be obtained therefrom.

$$V_{eend} = L_{endrate}\left(V_e 0 + \frac{N}{M}\right) - \frac{N}{M} \quad (25)$$

Figure 12:
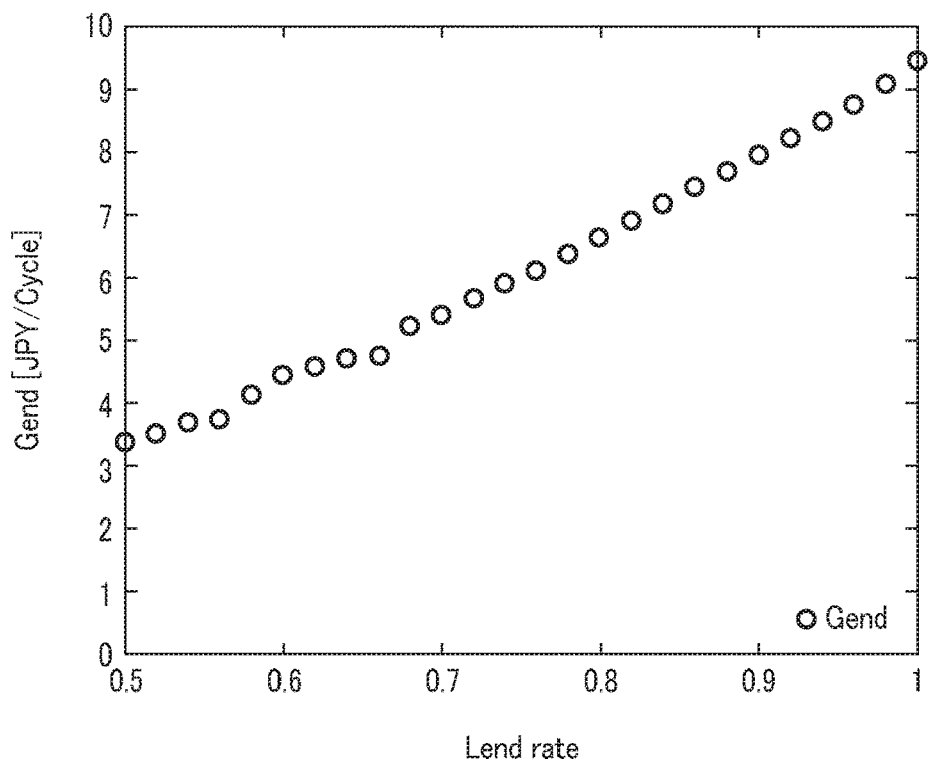
FIG. 12 is a view for describing a life definition and a life-end economic merit.

FIG. 12 illustrates the relationship between the life definition Lendrate and the life-end economic merit Gend in the case where, similarly as described above, the high value Thigh of the electricity rate is set at 25.33 yen/kWh and the low value Tlow is set at 17.46 yen/kWh. By finding the Gend, SOEc can be obtained. For example, in the lithium ion battery 8-serial module used in the present embodiment, if the life definition Lendrate is set at 0.6, 0.7, and 0.8, there is a relationship, as shown in FIG. 13, between the voltage difference Ve and the economic efficiency index SOEc.

The voltage difference Ve can be measured while the stationary lithium ion battery is being operated. Accordingly, if the relationship between the voltage difference Ve, and the full-charge capacity FCC and charge/discharge voltage Vc(SOC), Vd(SOC) is found in advance, the value of the economic efficiency index SOEc can be obtained therefrom. If the economic efficiency index SOEc of stationary lithium ion batteries, which are installed as a distributed cooperative system, can be obtained in real time, a stationary lithium rechargeable battery with a high profitability, among the stationary lithium batteries that are cooperatively controlled, can be selectively operated, and an operation with high economic efficiency can be performed.

The present invention is not limited to the above embodiments, and various modifications may be made without departing from the spirit of the invention. Further, various inventions, which solve the above-described problem, are extracted by selecting or combining structural elements that are disclosed.

Numerical Expression

The Specification

[Numerical expression 1]

$$SOE_c = (G_{curr} - G_{end})/(G_{new} - G_{end})$$

[Numerical expression 2]

$$G = (T_{high} \times E_d - T_{low} \times E_c)/1000$$

[Numerical expression 3]

$$G = (T_{high} \times E_d - T_{low} \times E_c)/1000$$

[Numerical expression 4]

$$G = (T_{high} \times E_d - T_{low} \times E_c)/1000$$

[Numerical expression 5]

$$SOE_c = (G_{curr} - G_{end})/(G_{new} - G_{end})$$

[Numerical expression 6]

$$Vpc(SOC) = \sum_{i=0}^{12} a_i SOC^i \quad (3)$$

-continued $$Vpd(SOC) = \sum_{i=0}^{12} b_i SOC^i \quad (4)$$

[Numerical expression ]7

$$Qcdig = [Qc1, Qc2, \ldots, Qcn] \quad (5)$$

$$Qddig = [Qd1, Qd2, \ldots, Qdn] \quad (6)$$

$$Vpcdig = [Vpc1, Vpc2, \ldots, Vpcn] \quad (7)$$

$$Vpddig = [Vpd1, Vpd2, \ldots, Vpdn]. \quad (8)$$

[Numerical expression ]8

$$Vpcdig = [A1Ve + B1, A2Ve + B2, \ldots, AnVe + Bn] \quad (9)$$

$$Vpddig = [C1Ve + D1, C2Ve + D2, \ldots, CnVe + Dn]. \quad (10)$$

[Numerical expression ]9

$$FCC = Qci + Qdn\text{-}i. \quad (11)$$

[Numerical expression ]10

$$Vpc\ dig(SOC) = Vpc\ dig(Qc\ dig/FCC) \quad (12)$$
$$= \sum_{i=0}^{12} a_i (Qc\ dig/FCC)^i$$

$$Vpd\ dig(SOC) = Vpd\ dig((FCC - Qd\ dig)/FCC) \quad (13)$$
$$= \sum_{i=0}^{12} a_i ((FCC - Qd\ dig)/FCC)^i.$$

[Numerical expression ]11

$$X_c = \begin{pmatrix} \left(\frac{Q_{c1}}{FCC}\right)^{12} & \cdots & \left(\frac{Q_{c1}}{FCC}\right)^0 \\ \vdots & \ddots & \vdots \\ \left(\frac{Q_{cn}}{FCC}\right)^{12} & \cdots & \left(\frac{Q_{cn}}{FCC}\right)^0 \end{pmatrix} \quad (14)$$

$$X_d = \begin{pmatrix} \left(\frac{FCC - Q_{d1}}{FCC}\right)^{12} & \cdots & \left(\frac{FCC - Q_{d1}}{FCC}\right)^0 \\ \vdots & \ddots & \vdots \\ \left(\frac{FCC - Q_{dn}}{FCC}\right)^{12} & \cdots & \left(\frac{FCC - Q_{dn}}{FCC}\right)^0 \end{pmatrix}. \quad (15)$$

[Numerical expression ]12

$$a = [a_1, a_2, \ldots a_{12}] \quad (16)$$

$$b = [b_1, b_2, \ldots b_{12}] \quad (17)$$

$$J_c = \|V_{cdig} - aX_C^T\| \quad (18)$$

$$J_d = \|V_{ddig} - bX_C^T\|. \quad (19)$$

[Numerical expression ]13

$$FCC = M \times Ve + N (M 及び N は定数). \quad (20)$$

[Numerical expression ]14

$$E_c = FCC \int_0^1 V_c(SOC) dSOC \quad (21)$$

$$E_d = FCC \int_0^1 V_d(SOC) dSOC. \quad (22)$$

[Numerical expression ]15

$$G = (T_{high} \times E_d - T_{low} \times E_c)/1000. \quad (23)$$

[Numerical expression ]16

$$SOE_c = (G_{curr} - G_{end})/(G_{new} - G_{end}) \quad (24)$$

[Numerical expression ]17

$$V_{eend} = L_{endrate}\left(V_e 0 + \frac{N}{M}\right) - \frac{N}{M} \quad (25)$$

<Claims>

$SOE_c=(G_{curr}-G_{end})/(G_{new}-G_{end})$ [Numerical expression]1.

$G=(T_{high}\times E_d-T_{low}\times E_c)/1000$ [Numerical expression]2.

$G=(T_{high}\times E_d-T_{low}\times E_c)/1000$ [Numerical expression]3.

$G=(T_{high}\times E_d-T_{low}\times E_c)/1000$ [Numerical expression]4.

$SOE_c=(G_{curr}-G_{end})/(G_{new}-G_{end})$ [Numerical expression]5.

The invention claimed is:

1. An economic efficiency estimation apparatus of a battery, comprising:
a charge unit configured to detect a charge state of a secondary battery and to fully charge the secondary battery up to a predetermined charge maximum voltage;
a discharge unit configured to electrically connect a load to the fully charged secondary battery, and to discharge power from the secondary battery;
a voltage measuring unit configured to measure a discharge voltage by starting measurement within a pre-specified time range after passage of a time in which a transitional response due to charge-transfer in the secondary battery disappears from a start of discharge by the discharge unit; and
an estimation arithmetic processor configured to estimate an economic efficiency index SOEc represented by an equation:

$SOE_c=(G_{curr}-G_{end})/(G_{new}-G_{end})$ where G is an economic merit for one charge-discharge cycle expressed by (Thigh×Ed−Tlow×Ec)/1000, the Gcurr is an economic merit for one current charge-discharge cycle, the Gnew is an economic merit for one charge-discharge cycle at a time when the secondary battery is new, and the Gend is an economic merit for one charge-discharge cycle at a time when a battery life ends, and further Ec [Wh] is a charge energy quantity, Ed [Wh] is a discharge energy quantity, Thigh [yen/kWh] is an electricity rate in a time zone with a high electricity rate, and Tlow [yen/kWh] is an electricity rate in a time zone with a low electricity rate,
the equation being correlated, by using a voltage difference between the discharge voltage calculated by measurement and the charge maximum voltage, with the voltage difference that is precalculated, and a full-charge capacity and a charge/discharge energy quantity of the secondary battery.

2. An economic efficiency estimation method of a battery for estimating an economic efficiency index SOEc of a secondary battery by an economic efficiency estimation apparatus of a battery, the method comprising:
a full-charge process of charging the secondary battery up to a preset charge maximum voltage Vc;
a stabilizing process of making a battery temperature agree with an ambient temperature after the full-charge process;

a discharge process executed after the stabilizing process;
a charge voltage estimation process of calculating and estimating an estimation charge voltage Vpc at a predetermined charge capacity of the secondary battery with respect to a plurality of charge capacities; and
a discharge voltage estimation process of calculating and estimating an estimation discharge voltage Vpd at the predetermined discharge capacity of the secondary battery with respect to a plurality of discharge capacities,
economic efficiency being estimated such that:
a voltage difference Ve between a discharge voltage Vd acquired by measurement started within a specified time after a transitional response due to charge-transfer in the discharge process disappears, and the charge maximum voltage Vc, is calculated,
a charge/discharge estimation process is executed in which,
the estimation charge voltage Vpc at the predetermined charge capacity calculated from the voltage difference Ve is estimated based on a relational expression, $Ve = Vc - Vd$ $Vpc = An \times Ve + Bn$ ($An$ and $Bn$ are constants)

between the voltage difference Ve that is precalculated and the estimation charge voltage Vpc at the predetermined charge capacity, and
the estimation discharge voltage Vpd at the predetermined discharge capacity calculated from the voltage difference Ve is estimated based on a relational expression, $Ve = Vc - Vd$ $Vpd = Cn \times Ve + Dn$ ($Cn$ and $Dn$ are constants)

between the voltage difference Ve that is precalculated and the estimation discharge voltage Vpd at the predetermined discharge capacity of the secondary battery,
from the charge/discharge estimation process, a charge curve is estimated by finding an approximate curve, based on a plurality of the estimation charge voltages Vpc, and a discharge curve is estimated by finding an approximate curve, based on a plurality of the estimation discharge voltages Vpd,
based on a relational expression, $FCC = M \times Ve + N$ ($M$ and $N$ are constants)

between the voltage difference Ve that is precalculated and a full-charge capacity FCC of the secondary battery, a full-charge capacity FCCcurr of a current charge-discharge cycle, which is calculated from the voltage difference Ve, is estimated, a charge energy quantity Eccurr of the current charge-discharge cycle is estimated from the full-charge capacity FCCcurr and the charge curve, and a discharge energy quantity Edcurr of the current charge-discharge cycle is estimated from the full-charge capacity FCCcurr and the discharge curve,
from a relational expression of an economic merit G for one charge-discharge cycle, which is expressed by an equation, $G = (T_{high} \times E_d - T_{low} \times E_c)/1000$ an economic merit Gcurr for one current charge-discharge cycle is estimated, and, based on the relational expression of the full-charge capacity FCC, an initial full-charge capacity FCC0, which is calculated from an initial voltage difference Ve0, is estimated,
an initial charge energy quantity Ec0 is estimated from the initial full-charge capacity FCC0 and the charge curve,
an initial discharge energy quantity Ed0 is estimated from the initial full-charge capacity FCC0 and the discharge curve, and, from the initial charge energy quantity Ec0 and the initial discharge energy quantity Ed0, an economic merit Gnew for one initial charge-discharge cycle is estimated based on the relational expression of the economic merit G for one charge-discharge cycle, which is expressed by an equation, $G = (T_{high} \times E_d - T_{low} \times E_c)/1000$ based on the relational expression of the full-charge capacity FCC,
a life-end full-charge capacity FCCend, which is calculated from a life-end voltage difference Veend, is calculated and estimated,
a life-end charge energy quantity Ecend is estimated from the life-end full-charge capacity FCCend and the charge curve,
a life-end discharge energy quantity Edend is estimated from the life-end full-charge capacity FCCend and the discharge curve,
from the life-end charge energy quantity Ecend and the life-end discharge energy quantity Edend, an economic merit Gend for one life-end charge-discharge cycle is estimated based on a relational expression of the economic merit G for one charge-discharge cycle, which is represented by an equation, $G = (T_{high} \times E_d - T_{low} \times E_c)/1000$ and
an economic efficiency index SOEc expressed by an equation, $SOE_c = (G_{curr} - G_{end})/(G_{new} - G_{end})$ is estimated.

* * * * *